(12) United States Patent
Dascher

(10) Patent No.: US 10,367,463 B2
(45) Date of Patent: Jul. 30, 2019

(54) VARIABLE GAIN DISTRIBUTED AMPLIFIER SYSTEMS AND METHODS

(71) Applicant: KEYSIGHT TECHNOLOGIES, INC., Santa Rosa, CA (US)

(72) Inventor: David Dascher, Loveland, CO (US)

(73) Assignee: Keysight Technologies, Inc., Santa Ana, CA (US)

( * ) Notice: Subject to any disclaimer, the term of this patent is extended or adjusted under 35 U.S.C. 154(b) by 591 days.

(21) Appl. No.: 15/177,459

(22) Filed: Jun. 9, 2016

(65) Prior Publication Data

US 2017/0359042 A1   Dec. 14, 2017

(51) Int. Cl.
| | | |
|---|---|---|
| *H03G 1/00* | (2006.01) | |
| *H03F 3/45* | (2006.01) | |
| *H03F 3/55* | (2006.01) | |
| *H03F 3/60* | (2006.01) | |

(52) U.S. Cl.
CPC ......... *H03G 1/0088* (2013.01); *H03F 3/4508* (2013.01); *H03F 3/55* (2013.01); *H03F 3/605* (2013.01); *H03F 2200/285* (2013.01); *H03F 2200/291* (2013.01); *H03F 2203/45288* (2013.01); *H03G 2201/40* (2013.01)

(58) Field of Classification Search
CPC ................................ H03G 1/0088; H03F 3/45
USPC ......................................................... 330/285
See application file for complete search history.

(56) References Cited

U.S. PATENT DOCUMENTS

| | | | | |
|---|---|---|---|---|
| 5,177,381 | A  * | 1/1993 | Friesen | .................... G06G 7/24 |
| | | | | 327/351 |
| 6,011,437 | A | 1/2000 | Sutardja et al. | |
| 6,094,099 | A | 7/2000 | Kobayashi | |
| 6,768,380 | B2 | 7/2004 | Hong et al. | |
| 7,271,657 | B2 * | 9/2007 | Friedrich | ............ H03F 3/45183 |
| | | | | 330/286 |
| 7,400,200 | B2 | 7/2008 | Fujii et al. | |
| 8,258,873 | B2 | 9/2012 | Buckwalter | |
| 8,823,455 | B2 * | 9/2014 | Kobayashi | .............. H03F 3/189 |
| | | | | 330/286 |
| 2006/0055464 | A1 * | 3/2006 | Leyten | ...................... H03F 1/18 |
| | | | | 330/286 |
| 2007/0176677 | A1 * | 8/2007 | Apel | ..................... H03F 1/0277 |
| | | | | 330/51 |
| 2007/0216485 | A1 * | 9/2007 | Fujii | ....................... H03F 1/342 |
| | | | | 330/286 |

(Continued)

OTHER PUBLICATIONS

Fritsche, David, et al. "A Trimmable Cascaded Distributed Amplifier With 1.6 THz Gain-Bandwidth Product." Terahertz Science and Technology, IEEE Transactions on 5.6 (2015): 1094-1096.

(Continued)

*Primary Examiner* — Patricia T Nguyen

(57) ABSTRACT

Distributed amplifier systems and methods are disclosed. An example distributed amplifier system includes first stage traveling wave amplifier (TWA) circuitry that is controllable to provide one of a first set of discrete gain settings. The first stage TWA circuitry includes a first input transmission line, a first output transmission line, and a first plurality of amplifiers coupled antiparallel between the first input transmission line and the first output transmission line. The first set of discrete gain settings has approximately constant logarithmic spacing.

20 Claims, 10 Drawing Sheets

(56) References Cited

U.S. PATENT DOCUMENTS

2010/0176885 A1* 7/2010 Kim .................. H03F 1/0261
330/295

OTHER PUBLICATIONS

Zakeri, Saeed, Ebrahim Abiri, and Hefzollah Mohammadian. "Broadband Traveling Wave Distributed Amplifier (TWDA) with Variable Gain By Control the Source Bulk Voltage."

* cited by examiner

FIG. 7

VARIABLE GAIN DISTRIBUTED AMPLIFIER SYSTEMS AND METHODS

TECHNICAL FIELD

The present subject matter relates to electronic amplifiers. More specifically, the present subject matter relates to distributed amplifiers and traveling wave amplifiers.

BACKGROUND

Variable gain amplifiers are commonly used in test instruments to re-size input signals of various amplitudes to properly match the range of subsequent circuitry. Such circuitry includes track-and-hold circuits, sampler-and-hold circuits, and analog-to-digital converters. Most variable gain amplifiers use lumped, as opposed to distributed, amplifier designs. A key limitation of a lumped amplifier is achievable bandwidth. This achievable bandwidth is typically limited to approximately $f_{max}/6$, wherein $f_{max}$ is a maximum oscillation frequency of the underlying transistor technology. Distributed amplifiers may achieve a bandwidth of $f_{max}/3$. Various solutions that use distributed amplifiers in order to solve the bandwidth problem also use variable bias to achieve variable gain. However variable bias increases distortion as the bias is decreased. As such, the useful range of gain variation is limited because of the increased amount of distortion. There is a need for techniques that achieve a wide variable gain, high bandwidth, and low distortion.

SUMMARY

Variable gain distributed amplifier systems and methods are disclosed herein. In a representative embodiment, a distributed amplifier system includes first stage traveling wave amplifier (TWA) circuitry that is controllable to provide one of a first set of discrete gain settings. The first set of discrete gain settings has approximately constant logarithmic spacing and the first stage TWA circuitry includes a first plurality of amplifiers coupled antiparallel between a first input transmission line and a first output transmission line. Each input of the first plurality of amplifiers is coupled with the first input transmission line. Each output of the first plurality of amplifiers is coupled with the first output transmission line.

In other embodiments, each of the first plurality of amplifiers is configured to independently switch between an ON state and an OFF state by a first plurality of binary control signals. Each of the first plurality of amplifiers may be a transconductance amplifier.

In other embodiments, second stage TWA circuitry is coupled in series with the first stage TWA circuitry. The second stage TWA circuitry is controllable to provide one of a second set of discrete gain settings. The second set of discrete gain settings has approximately constant logarithmic spacing and the second stage TWA circuitry includes a second plurality of amplifiers coupled anti-parallel between a second input transmission line and a second output transmission line. Each of the second plurality of amplifiers may be configured to independently switch between an ON state and an OFF state by a second plurality of binary control signals. One or more of the second plurality of amplifiers may be further configured as a frequency peaking amplifier. Level shifting circuitry may be used to DC couple the first output transmission line and the second input transmission line. The level shifting circuitry may include an emitter follower amplifier or a source follower amplifier.

In other embodiments, the first input transmission line may be a single ended transmission line. The first output transmission line, the second input transmission, and the second output transmission line may be coupled transmission lines. The first input transmission line may be configured to provide a characteristic impedance of approximately 50 ohms. The first output transmission line, the second input transmission line, and the second output transmission line may each be configured to provide a characteristic impedance between 25 ohms and 100 ohms.

In other embodiments, the distributed amplifier system may be controllable to provide a gain of at least 18 decibels (dB). The first set of discrete gain settings may be spaced apart by more than 3.0 dB and the second set of discrete gain settings may be spaced apart by less than 1.0 dB. A range of the first set of discrete gain settings may be at least 16 dB and a range of the second set of discrete gain settings may be at least 3 dB.

In other embodiments, a first amplifier of the first plurality of amplifiers includes a bipolar junction transistor (BJT). The distributed amplifier system may be configured to provide bandwidth from DC to greater than 33% of a maximum oscillation frequency of the BJT. The maximum oscillation frequency may be greater than 100 gigaHertz. The distributed amplifier system may be further configured to provide a noise spectral density less than 1.5 nanovolts per square root Hertz and a total harmonic distortion less than −40 dB.

In other embodiments, two or more of the second plurality of amplifiers may be further configured as frequency peaking amplifiers. The second stage TWA circuitry may be controllable to provide one of a set of frequency peaking profiles.

In other embodiments, the distributed amplifier system may be implemented within signal input circuitry of at least one of an oscilloscope, a spectrum analyzer, or a signal analyzer.

BRIEF DESCRIPTION OF THE DRAWINGS

The illustrated embodiments of the disclosed subject matter will be best understood by reference to the drawings, wherein like parts are designated by like numerals throughout. The following description is intended only by way of example, and simply illustrates certain selected embodiments of devices, systems, and processes that are consistent with the disclosed subject matter as claimed herein.

FIG. 7 is a more detailed circuit diagram of the second stage TWA circuitry in accordance with embodiments of the present disclosure.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally distributed amplifiers and more specifically to traveling wave amplifiers (TWAs). These devices may be implemented by arranging various components anti-parallel to an input transmission line and an output transmission line. With this arrangement their functional properties (e.g., transconductance) are added linearly while parasitic properties, such as inductance and capacitance, are distributed along the transmission lines rather than lumped together at a single input or output point.

The described embodiments find ready application in various contexts in which high frequency signals are processed, such as, but not limited to, computing systems, communication systems, and test and measurement systems. For example, a test instrument for RF devices such as an oscilloscope, a spectrum analyzer, or a signal analyzer may comprise at least one distributed amplifier system as described below. The distributed amplifier system may be implemented within signal input circuitry of the test instrument.

Figure 1:
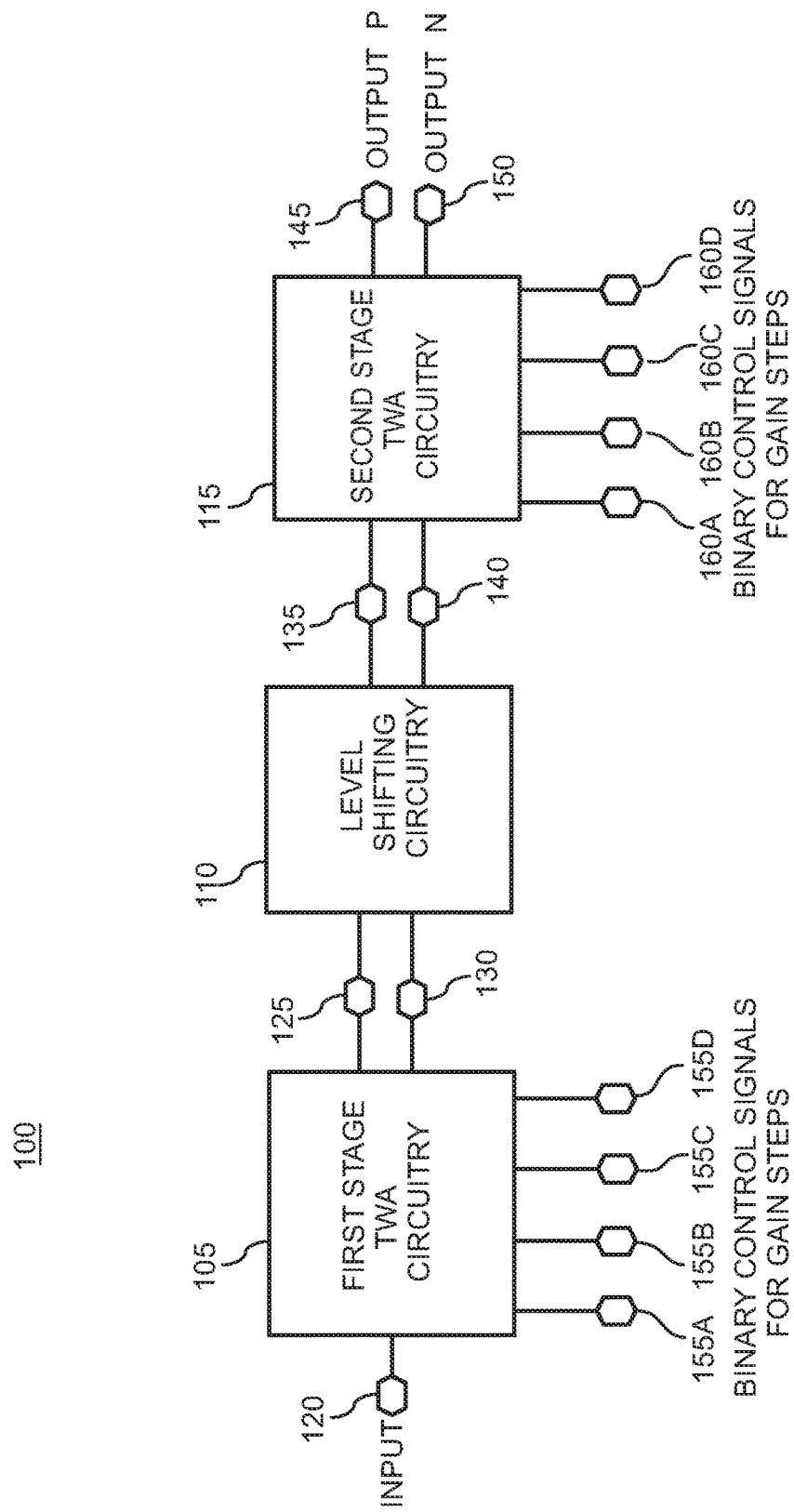
FIG. 1 is a simple circuit diagram of a distributive amplifier system, in accordance with a representative embodiment.

FIG. 1 illustrates a circuit diagram illustrating a distributive amplifier system 100, in accordance with embodiments of the present disclosure. The distributed amplifier system 100 may be configured to be controllable to provide a gain of at least 18 decibels (dB) and includes first stage TWA circuitry 105, level shifting circuitry 110, and second stage TWA circuitry 115. The first stage TWA circuitry 105 may be configured to provide a coarse gain adjustment. The second stage TWA circuitry 115 may be configured to provide a fine gain adjustment. The level shifting circuitry 110 may be configured to provide DC bandwidth while allowing for a common-mode voltage difference between the first stage TWA circuitry 105 and the second stage TWA circuitry 115.

The first stage TWA circuitry 105 may be further configured to receive an analog signal that may be provided to input 120. The first stage TWA circuitry 105 may be controllable to provide one of a first set of discrete gain settings via a first plurality of binary control signals. Binary inputs 155A-D are configured to receive the first plurality of binary control signals. The first set of discrete gain settings may be spaced apart by more than 3.0 decibels (dB) and may have a range of at least 16 dB. An output of the first stage TWA circuitry 105 may be differentially DC coupled with an input of the level shifting circuitry 110 via interconnects 125 and 130.

The level shifting circuitry 110 can be configured to adapt the analog signal from a positive common mode output voltage of the first stage TWA circuitry 105 to a negative common-mode input voltage of the second stage TWA circuitry 115. An output of the level shifting circuitry 110 may be differentially DC coupled with an input of the second stage TWA circuitry 115 via interconnects 135 and 140. The level shifting circuitry 110 may be configured to provide a gain reduction of approximately 6 dB from source terminations (not shown in FIG. 1), wherein source terminations are configured for impedance matching with the second stage TWA circuitry 115.

The second stage TWA circuitry 115 may be controllable to provide one of a second set of discrete gain settings via a second plurality of binary control signals. Binary inputs 160A-D are configured to receive the second plurality of binary control signals. A range of the second set of discrete gain settings may be at least 3 dB and the second set of discrete gain settings may be spaced apart by less than 1.0 dB. An output of the second stage TWA circuitry 115 may be configured to differentially provide an amplified version of the analog signal via positive output (OUTPUT P) 145 and negative output (OUTPUT N) 150.

Figure 2:
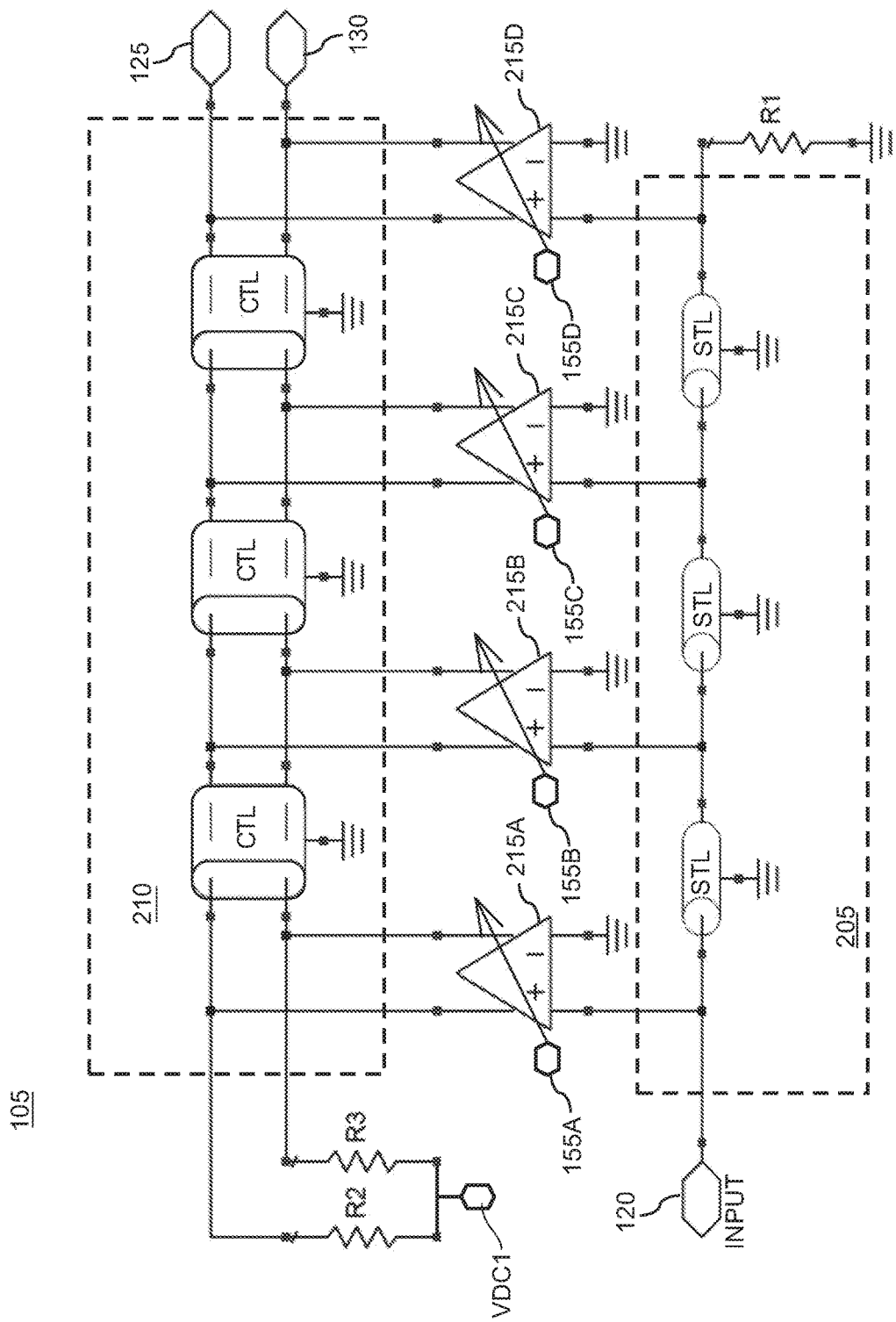
FIG. 2 is a simple circuit diagram of first stage traveling wave amplifier (TWA) circuitry in accordance with embodiments of the present disclosure.

FIG. 2 illustrates a simple circuit diagram of a first stage TWA circuitry in accordance with embodiments of the present disclosure. In this example, the first stage TWA circuitry 105 includes a first input transmission line 205, a first output transmission line 210, and a first plurality of amplifiers including amplifiers 215A-D.

The first input transmission line 205 is a single ended transmission line and comprises a plurality of single ended transmission line (STL) elements. The first input transmission line 205 may be configured to receive the analog signal from the input 120. Each of the STL elements are configured to provide a characteristic delay for the analog signal. The first input transmission line 205 may be configured to provide a characteristic impedance of approximately 50 ohms. External circuitry providing the analog signal to input 120 may provide a source impedance and resistor R1 provides a termination impedance for the first input transmission line 205.

The first output transmission line 210 may be a coupled transmission line and may include multiple coupled transmission line (CTL) elements. Each of the CTL elements comprises a smaller transmission line and has the characteristic delay of each of the STL elements. The first output transmission line 210 may be configured to provide an odd mode characteristic impedance between 25 ohms and 100 ohms. Resistors R2 and R3 are coupled with a DC bias voltage VDC1 and provide a source impedance for the first output transmission line 210. The output transmission line 210 is differentially coupled with the level shifting circuitry 110 via interconnects 125 and 130. A termination impedance (not shown in FIG. 2) can be provided by the level shifting circuitry 110.

The amplifiers 215A-D are coupled antiparallel such that each input of amplifiers 215A-D is coupled with the first input transmission line 205 and each output of amplifiers 215A-D is coupled with the first output transmission line 210. The amplifiers 215A-D are configured to independently switch between an ON state and an OFF state by the first plurality of binary control signals provided to binary inputs 155A-D. Amplifiers 215A-D may each be a transconductance amplifier. High impedance current drives can be provided to the first output transmission line 210 between CTL elements.

During example operation, the analog signal propagates down the first input transmission line 205. Each ON state amplifier of the amplifiers 215A-D responds by inducing an amplified and complementary forward traveling wave on the first output transmission line 210. The first stage TWA circuitry 105 is configured such that the STL and CTL elements all produce substantially equal delay, which results in the respective outputs of ON state amplifiers summing in phase. The STL and CTL elements typically take the form of circuit traces, such as those produced by known integrated circuit (IC) manufacturing processes, and their characteristic delays are determined, at least in part, by the properties of those circuit traces. The substantially equal delays may be accomplished through proper selection of propagation constants and lengths of the circuit traces. The source and termination impedances are included on the respective transmission lines to minimize destructive signal reflections.

The overall gain of the first stage TWA circuitry 105 is generally a linear function of the number of ON state amplifiers of the amplifiers 215A-D. More specifically, the first stage TWA circuitry 105 exhibits a discrete additive gain with each ON state amplifier. In embodiments, the plurality of amplifiers 215A-D when in their ON state may provide the following discrete additive gains:

| Amplifier | Gain |
|---|---|
| 215A | 1.00 |
| 215B | 1.48 |
| 215C | 2.21 |
| 215D | 2.34 |

As such the first stage TWA circuitry 105 may be controllable to provide each step of the following discrete gain settings having approximately constant logarithmic spacing:

| 155A | 155B | 155C | 155D | Gain | Gain (dB) |
|---|---|---|---|---|---|
| 1 | 0 | 0 | 0 | 1.00 | 0.0 dB |
| 0 | 1 | 0 | 0 | 1.48 | 3.4 dB |
| 0 | 0 | 1 | 0 | 2.21 | 6.9 dB |
| 1 | 0 | 0 | 1 | 3.34 | 10.1 dB |
| 1 | 1 | 0 | 1 | 4.82 | 13.7 dB |
| 1 | 1 | 1 | 1 | 7.03 | 16.9 dB |

These discrete additive gains of amplifiers 215A-D, coupled with the distribution of parasitic capacitance and inductances across the respective transmission lines, enable the first stage TWA circuitry 105 to achieve an increased gain-bandwidth product while maintaining a desired signal-to-noise ratio (SNR).

Figure 3:
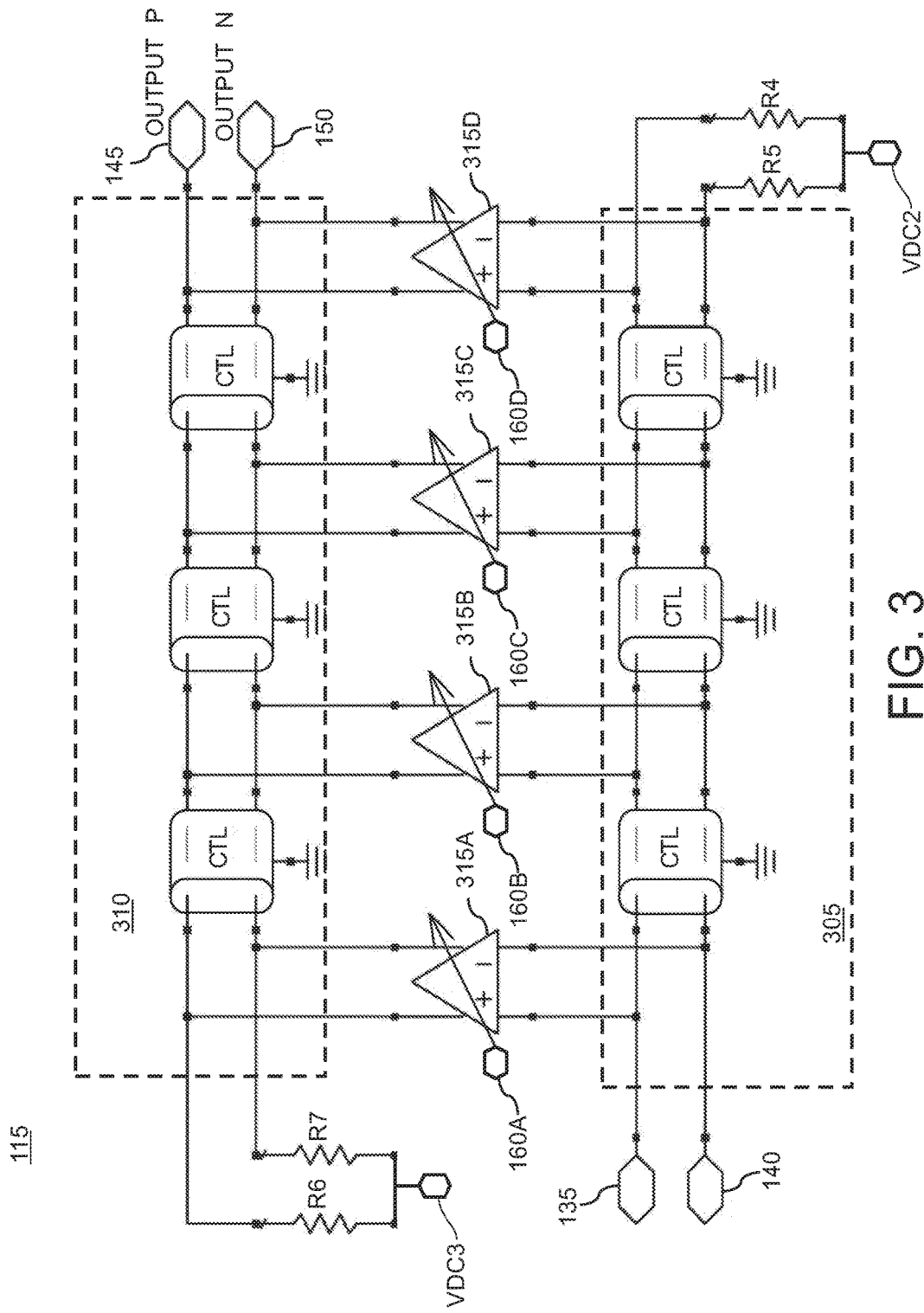
FIG. 3 is a simple circuit diagram of second stage TWA circuitry in accordance with embodiments of the present disclosure.

FIG. 3 illustrates a circuit diagram of the second stage TWA circuitry 115 in accordance with embodiments of the present disclosure. The second stage TWA circuitry 115 includes a second input transmission line 305, a second output transmission line 310, and a second plurality of amplifiers including amplifiers 315A-D.

The second input transmission line 305 may be a coupled transmission line and include multiple CTL elements. Each of the CTL elements function in a manner as described for the first output transmission line 210. The second input transmission line 305 may be configured to provide an odd mode characteristic impedance between 25 ohms and 100 ohms. The second input transmission line 305 is differentially coupled with the level shifting circuitry 110 via interconnects 135 and 140. The level shifting circuitry 110 may provide a source impedance for the second input transmission line 305. Resistors R4 and R5 are coupled with a DC bias voltage VDC2 and provide a termination impedance for the second input transmission line 305.

The second output transmission line 310 may be a coupled transmission line and include multiple CTL elements. Each of the CTL elements function in a manner as described for the first output and second input transmission lines 210 and 305. The second output transmission line 310 may be configured to provide an odd mode impedance between 25 ohms and 100 ohms. Resistors R6 and R7 are coupled with a DC bias voltage VDC3 and provide a source impedance for the second output transmission line 310. The second output transmission line 310 is differentially coupled with OUTPUT P 145 and OUTPUT N 150. Subsequent circuitry may provide a termination impedance for the second output transmission line 310.

The amplifiers 315A-D are coupled antiparallel such that each input of amplifiers 315A-D is coupled with the second input transmission line 305 and each output of amplifiers 315A-D is coupled with the second output transmission line 310. The amplifiers 315A-D are configured to independently switch between an ON state and an OFF state via binary inputs 160A-D. The amplifiers 315A-D may each be a transconductance amplifier, wherein high impedance current drives are provided to the second output transmission line 310 between CTL elements.

Typical design, manufacturing, and operation of the second stage TWA circuitry 115 can be understood generally by analogy with the description to the first stage TWA circuitry 105 of FIG. 2.

In embodiments, the amplifiers 315A-D when in their ON state may provide the following discrete additive gains:

| Amplifier | Gain |
|---|---|
| 315A | 0.16 |
| 315B | 0.29 |
| 315C | 0.34 |
| 315D | 1.71 |

As such the second stage TWA circuitry 115 may be controllable to provide each step of the following discrete gain settings having approximately constant logarithmic spacing:

| 160A | 160B | 160C | 160D | Gain | Gain (dB) |
|---|---|---|---|---|---|
| 0 | 0 | 0 | 1 | 1.71 | 4.6 dB |
| 1 | 0 | 0 | 1 | 1.87 | 5.4 dB |

| 160A | 160B | 160C | 160D | Gain | Gain (dB) |
|---|---|---|---|---|---|
| 0 | 1 | 0 | 1 | 2.00 | 6.0 dB |
| 1 | 1 | 0 | 1 | 2.16 | 6.7 dB |
| 0 | 1 | 1 | 1 | 2.33 | 7.4 dB |
| 1 | 1 | 1 | 1 | 2.49 | 7.9 dB |

Figure 4:
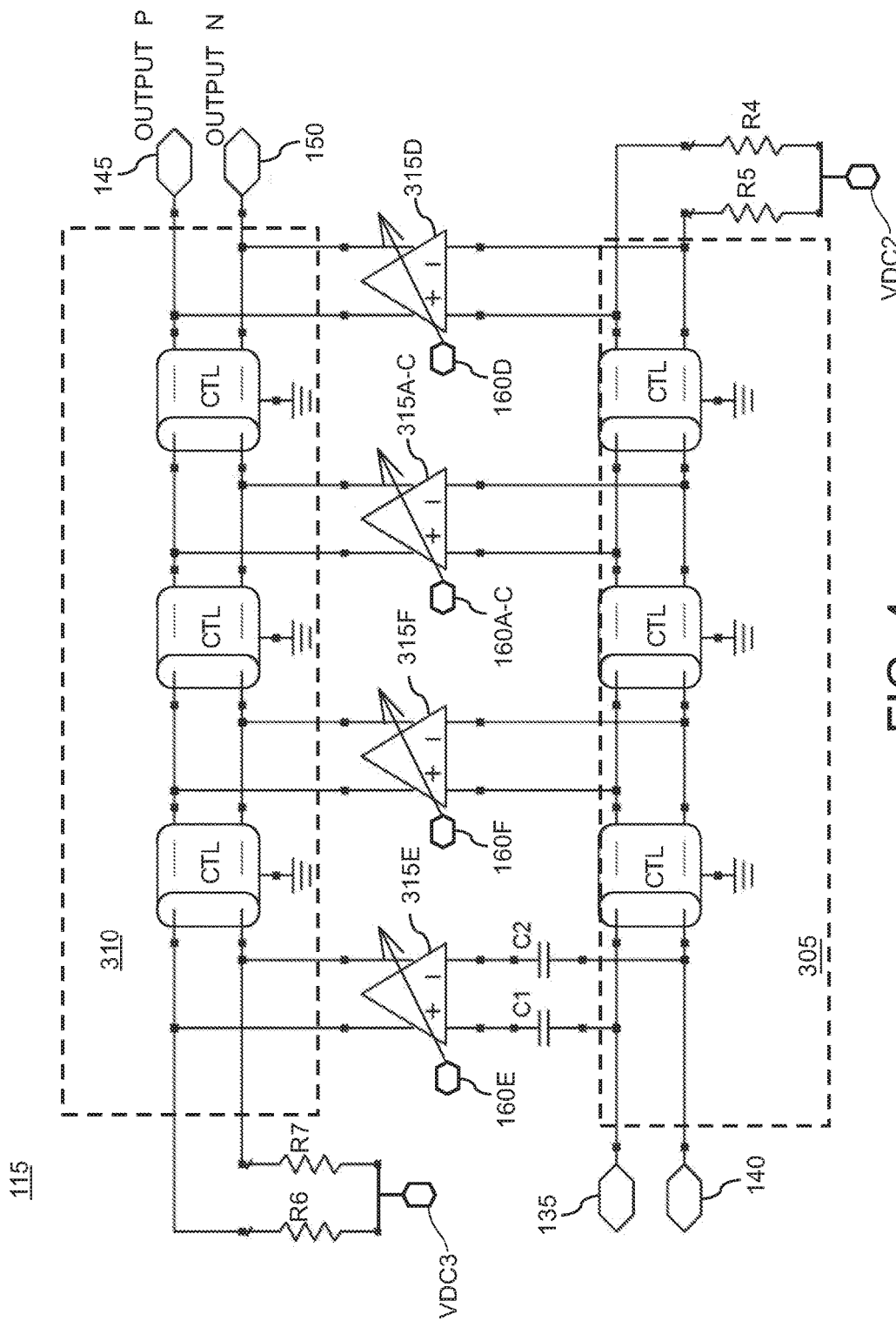
FIG. 4 is a simple circuit diagram of the second stage TWA circuitry further configured to provide frequency peaking in accordance with embodiments of the present disclosure.

FIG. 4 illustrates a circuit diagram of the second stage TWA circuitry 115 further configured to provide frequency peaking in accordance with embodiments of the present disclosure. The second plurality of amplifiers further comprise amplifiers 315E and 315F including binary inputs 160E and 160F. For simplicity of illustration amplifiers 315A-C are shown as a single amplifier symbol. Amplifiers 315E and 315F are configured as frequency peaking amplifiers. Capacitors C1 and C2 couple amplifier 315E with the second input transmission line 305.

The amplifiers 315E and 315F are configured to independently switch between an ON state and an OFF state via binary inputs 160E and 160F. In this embodiment, the second stage TWA circuitry 115 is controllable to provide one of a set of frequency peaking profiles. As such, amplifiers 315E and 315G are each configured to provide in an ON state first and second frequency peaking profiles. The first frequency peaking profile may include high frequency spectra that is boosted by 2 dB at the bandwidth of the amplifier. The second frequency peaking profile may include high frequency spectra that is boosted by 4 dB at the bandwidth of the amplifier.

Amplifiers 315A-D may each be a transconductance amplifier, wherein high impedance current drives are provided to the second output transmission line 310 between CTL elements.

In embodiments, the second plurality of amplifiers may include additional frequency peaking amplifiers. In other embodiments, the second plurality of amplifiers may comprise a single frequency peaking amplifier. In other embodiments, the first stage TWA circuitry 105 may be further configured to provide frequency peaking.

Figure 5:
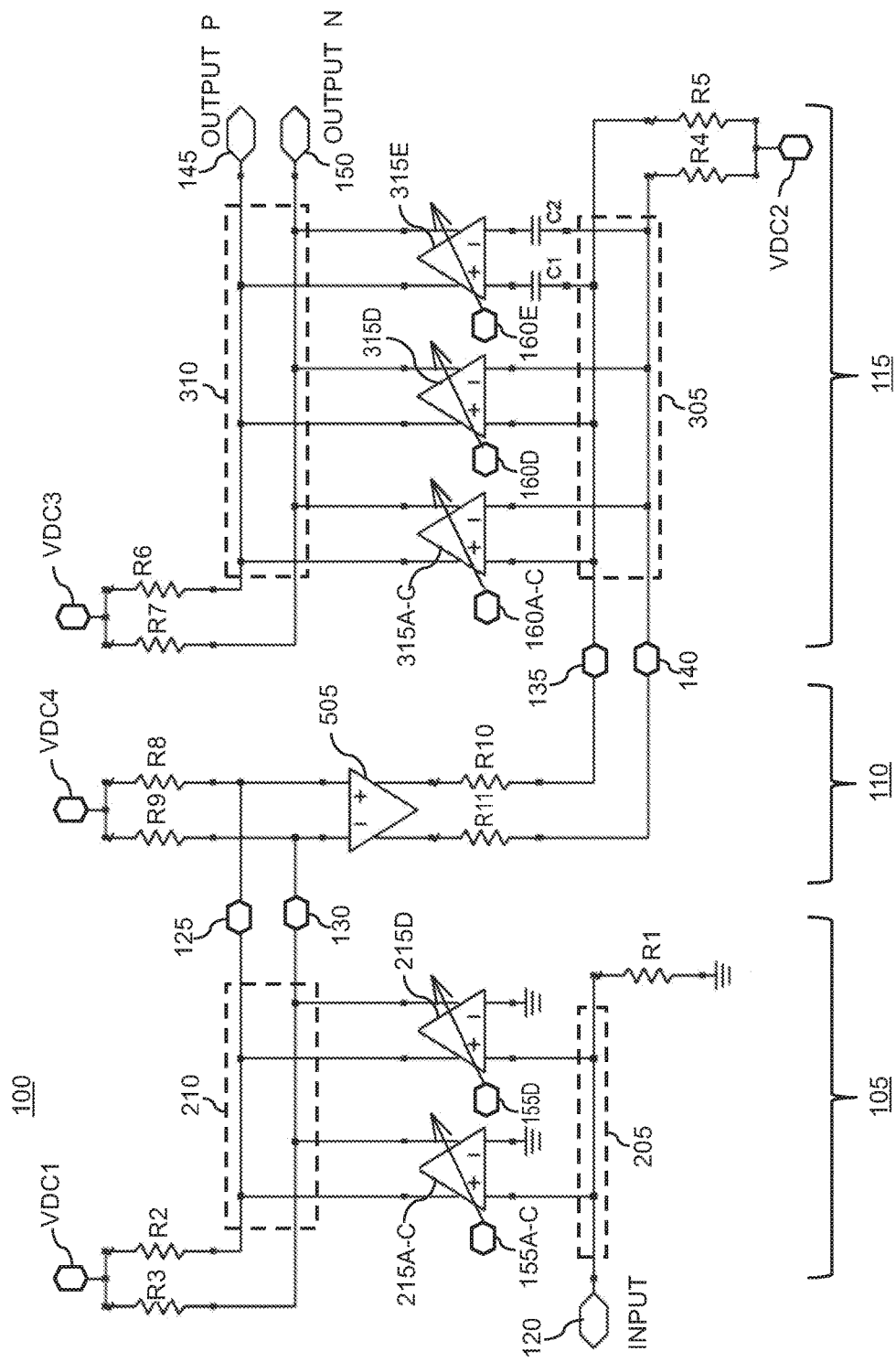
FIG. 5 is a more detailed circuit diagram of the distributive amplifier system in accordance with embodiments of the present disclosure.

FIG. 5 illustrates a circuit diagram of the distributive amplifier system 100 in accordance with embodiments of the present disclosure. In this example, the second plurality of amplifiers comprise amplifiers 315A-E. Amplifier 315E is configured for frequency peaking. For simplicity of illustration, amplifiers 215A-C are shown as a single amplifier symbol and amplifiers 215A-C are shown as a single amplifier symbol.

The level shifting circuitry 110 includes differential emitter follower circuitry 505, and resistors R8-11. Resistors R2 and R3 are coupled with DC bias voltage VDC1. Resistors R8 and R9 are coupled with a DC bias voltage VDC4 and provide the termination impedance for the first output transmission line 210. Resistors R10 and R11 are coupled with an output of the differential emitter follower circuitry 505 and provide the source impedance for the second input transmission line 305.

Figure 6:
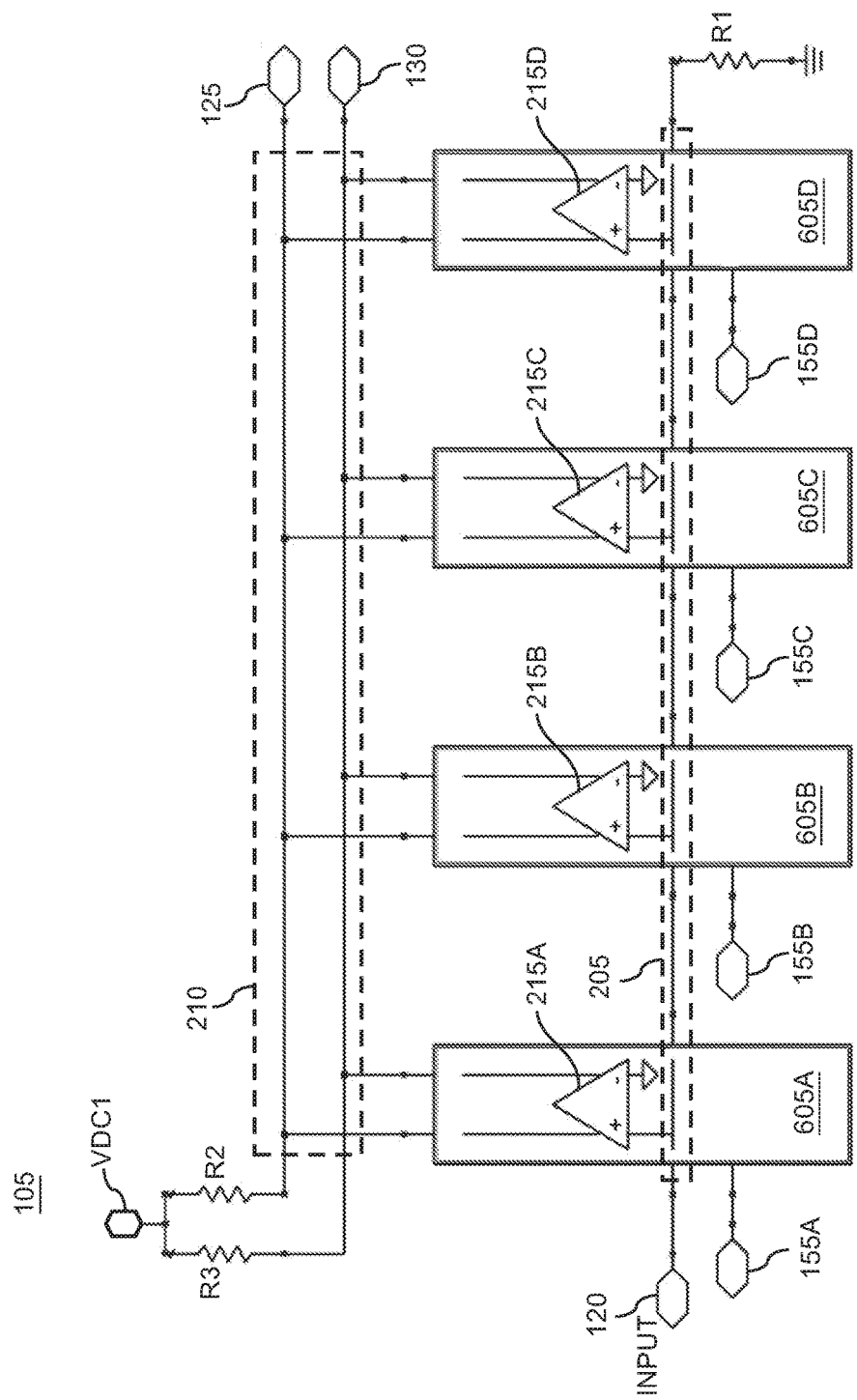
FIG. 6 is a more detailed circuit diagram of the first stage TWA circuitry in accordance with embodiments of the present disclosure.

FIG. 6 illustrates a circuit diagram of the first stage TWA circuitry 105 in accordance with embodiments of the present disclosure. The first stage TWA circuitry 105 includes a first plurality of amplifier sections including amplifier sections 605A-D. Amplifier sections 605A-D each includes a respective amplifier of amplifiers 215A-D and an associated STL element of the first input transmission line 205. Typical design, manufacturing, and operation of the first stage TWA circuitry 105 of FIG. 6 can be understood generally by analogy with the description of FIG. 2.

Figure 7:
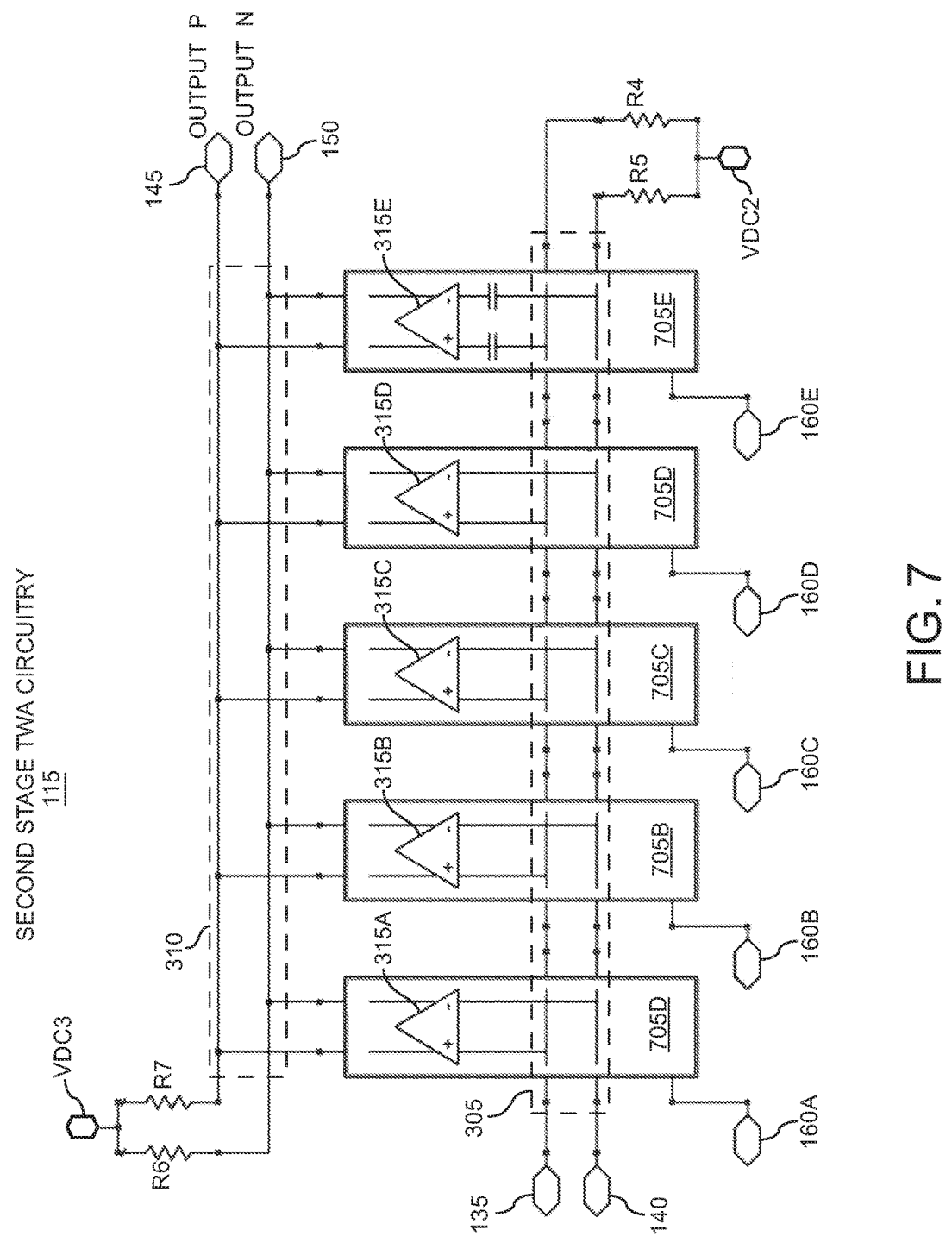

FIG. 7 illustrates a circuit diagram of the second stage TWA circuitry 115 in accordance with embodiments of the present disclosure. The second stage TWA circuitry 115 includes a second plurality of amplifier sections including amplifier sections 705A-E. Amplifier sections 705A-E each comprise a respective amplifier of amplifiers 315A-E and an associated CTL element of the first input transmission line 305. Typical design, manufacturing, and operation of the second stage TWA circuitry 115 of FIG. 7 can be understood generally by analogy with the descriptions of FIG. 3 and FIG. 4.

Figure 8:
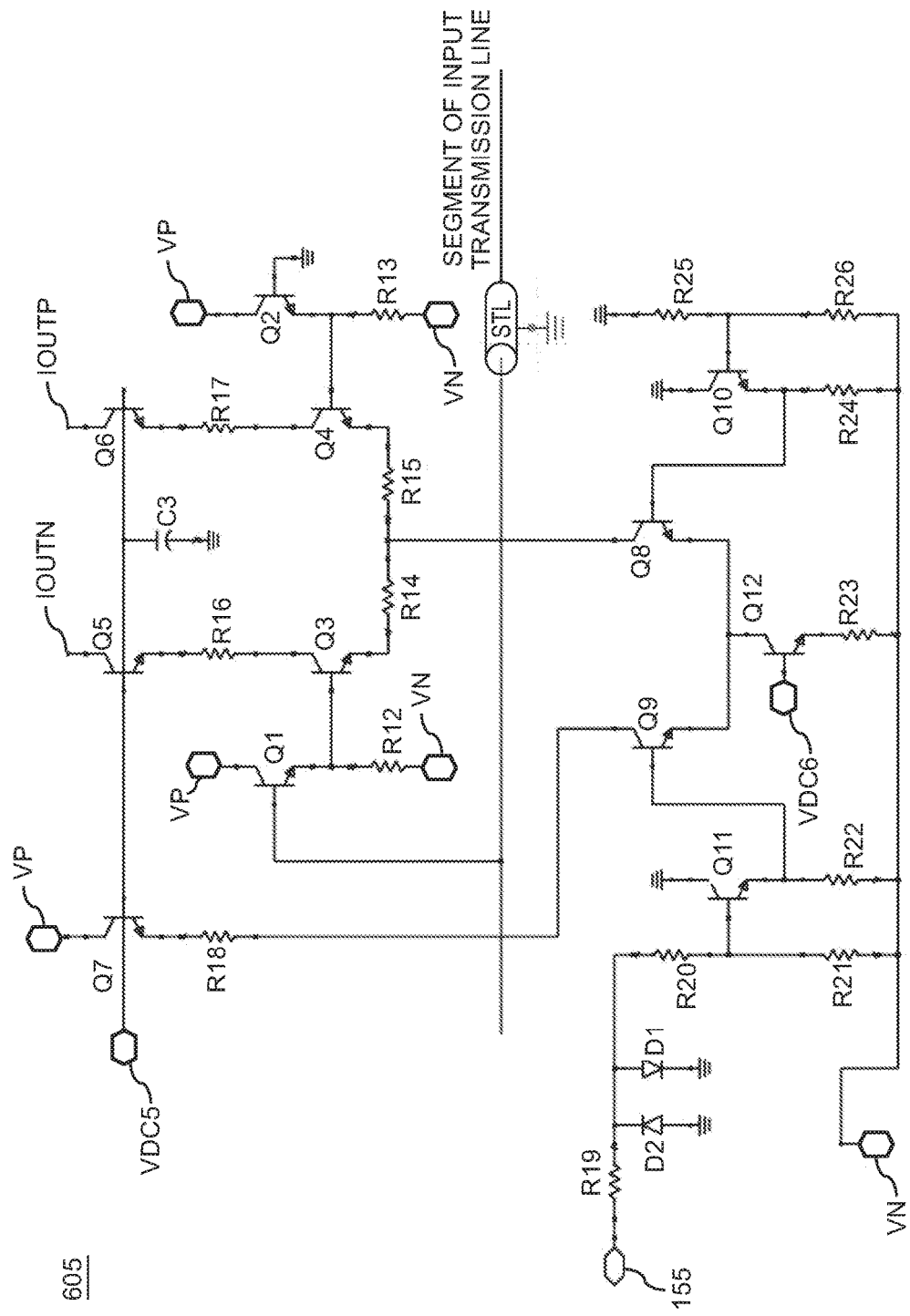
FIG. 8 is a circuit diagram of an amplifier included in the first stage TWA circuitry in accordance with embodiments of the present disclosure.

FIG. 8 illustrates a circuit diagram of an amplifier section 605 included in the first stage TWA circuitry 105 of FIG. 6 in accordance with embodiments of the present disclosure. The amplifier section 605 may be representative of any one of amplifier sections 605A-D. The amplifier section 605 comprises transistors Q1-12, resistors R12-27, diodes D1 and D2, a capacitor C3, and a STL element of the first input transmission line 205.

Transistors Q1-6 and resistors R12-17 are configured as a differential amplifier having a transconductance gain. Transistors Q1 and Q2 and resistors R12 and R13 are configured as emitter follower amplifiers providing input stages for the differential amplifier. Collectors of Q1 and Q2 are coupled with a positive supply voltage VP. A base of transistor Q1 is configured as a non-inverting input for the differential amplifier and is coupled with a first conductor of the STL element. A base of transistor Q2 is configured as an inverting input for the differential amplifier and is coupled with ground.

Transistors Q3 and Q5 are configured as a first cascode stage of the differential amplifier. Resistor R16 is coupled between an emitter of transistor Q5 and a collector of transistor Q3. An emitter of Q1 is coupled with a base of Q3 and resistor R12. Resistor R12 is further coupled with a negative supply voltage VN. Transistors Q4 and Q8 are configured as a second cascode stage of the differential amplifier. Resistor R17 is coupled between an emitter of Q6 and a collector of Q4. An emitter of Q2 is coupled with a base of Q4 and resistor R13. Resistor R13 is further coupled with negative supply voltage VN. Collectors of transistor Q5 and Q6 are coupled with the first output transmission line 210 and respectively provide differential current drivers IOUTN and IOUTP. A DC bias voltage VDC5 is coupled with bases of transistors Q5 and Q6 and capacitor C3. Capacitor C3 is further coupled with ground and is configured to provide filtering for DC bias voltage VDC5.

Emitters of transistors Q3 and Q4 are respectively coupled with resistors R14 and R15. Resistors R14 and R15 are further coupled with a collector of transistor Q8. A gain of the amplifier section 605 is determined by values of resistors R14 and R15. Transistors Q8, Q10, and Q12 and resistors R23-26 are configured as a constant current source to provide a bias current for the differential amplifier. A DC bias voltage VDC6 is coupled with a base of Q12, and an emitter of Q12 is coupled with negative supply voltage VN through resistor R23. An emitter of Q8 is coupled with a collector of transistor Q12. A base of Q8 and an emitter of transistor Q10 are coupled together and couple with negative supply voltage VN through resistor R24. A collector of Q10 is coupled with ground. A base of Q10 is coupled with ground through resistor R25 and coupled with negative supply voltage VN through resistor R26, Diodes D1 and D2, transistors Q7, Q9, Q11, and Q12 and resistors R18-22 are configured as a switch to toggle the amplifier section 605 between the ON state and the OFF state. Binary input 155 is coupled with R19 and may be representative of any of binary inputs 155A-D. R19 is further coupled with an anode of diode D1, a cathode of diode D2, and resistor R20. A cathode of diode D1 and an anode of diode D2 are coupled with ground. Resistor R20 and diodes D1 and D2 protect the amplifier section 605 from excessive voltage levels provided to binary input 155. Resistor R20 is further coupled with a base of Q11 and resistor R21. An emitter of transistor Q11 is coupled with a base of transistor Q9 and resistor R22. Resistors R21 and R22 are further coupled with ground. A collector and a base of transistor Q7 are respectively coupled with positive supply voltage VP and DC bias voltage VDC5. An emitter of transistor Q7 is coupled with a collector of Q9 through resistor R18. The emitter of transistor Q8 and the collector of transistor Q12 are further coupled with a collector of transistor Q9. When current flows out of binary input 155, a voltage on the base of transistor Q11 is lower than a voltage on the base of transistor Q12, and the constant current source provides the bias current to the differential amplifier (i.e. ON state). When current flows in to binary input 155, the voltage on the base of transistor Q11 is greater than the voltage on the base of transistor Q12, and the bias current is shunted away from the differential amplifier (i.e. OFF state).

Figure 9:
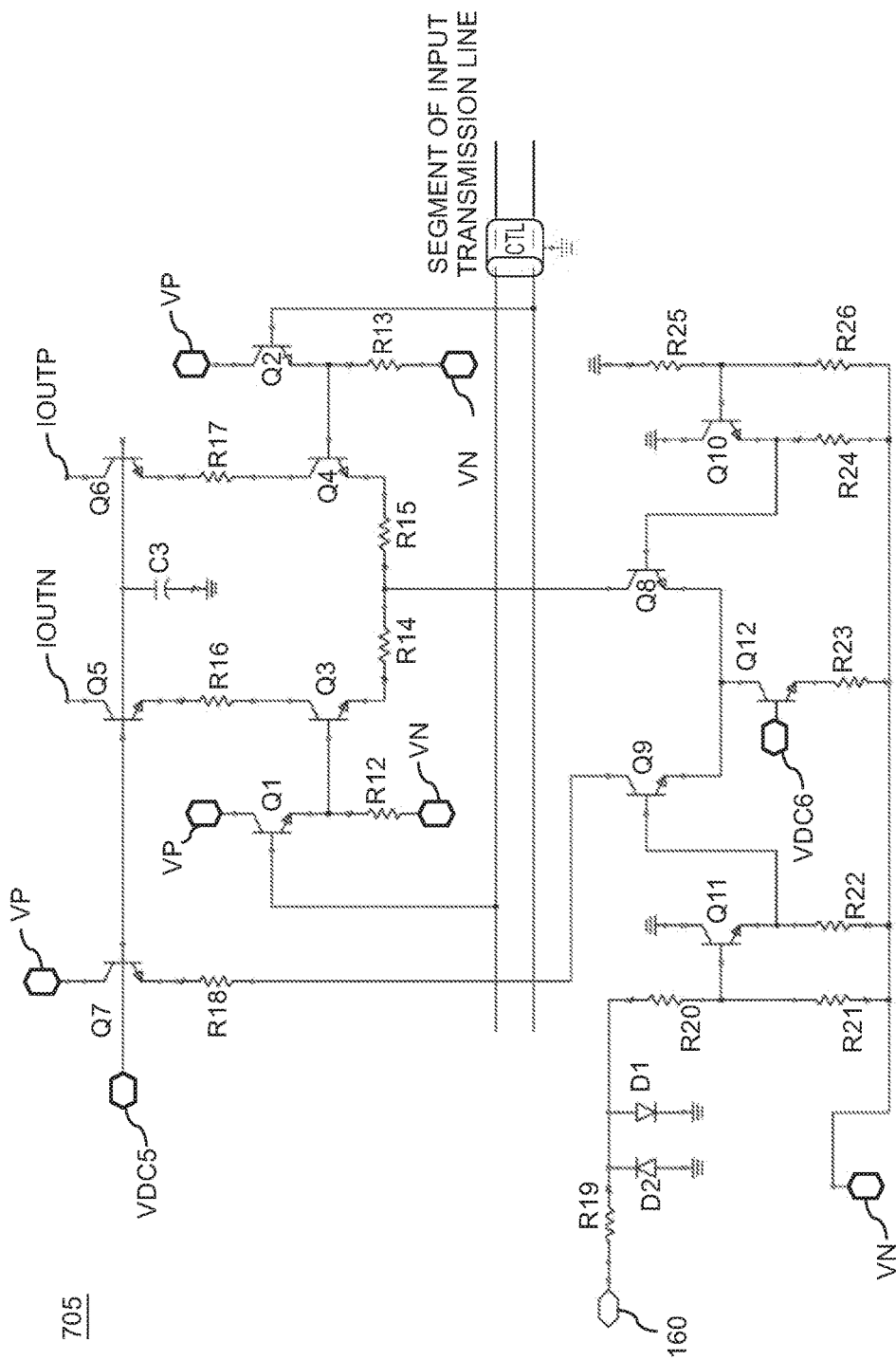
FIG. 9 is a circuit diagram of an amplifier included in the second stage TWA circuitry in accordance with embodiments of the present disclosure.

FIG. 9 illustrates a circuit diagram of an amplifier section 705 included in the second stage TWA circuitry 115 of FIG. 7 in accordance with embodiments of the present disclosure. The amplifier section 705 may be representative of any one of amplifier sections 705A-F. The circuit diagram of amplifier section 705 is similar to the amplifier section 605 of FIG. 8 with the exception of the STL element of FIG. 8 is replaced with a CTL element associated with the second input transmission line 305. Additionally, the base of transistor Q1 is coupled with a first conductor of the CTL element and the base of transistor Q2 is coupled with a second conductor of CTL element. The collectors of transistor Q5 and Q6 are coupled with the second output transmission line 310 and R19 is coupled with one of the binary inputs 160A-E. Typical design, manufacturing, and operation of the amplifier section 705 of FIG. 9 can be understood generally by analogy with the description of the amplifier section 605 of FIG. 8.

Figure 10:
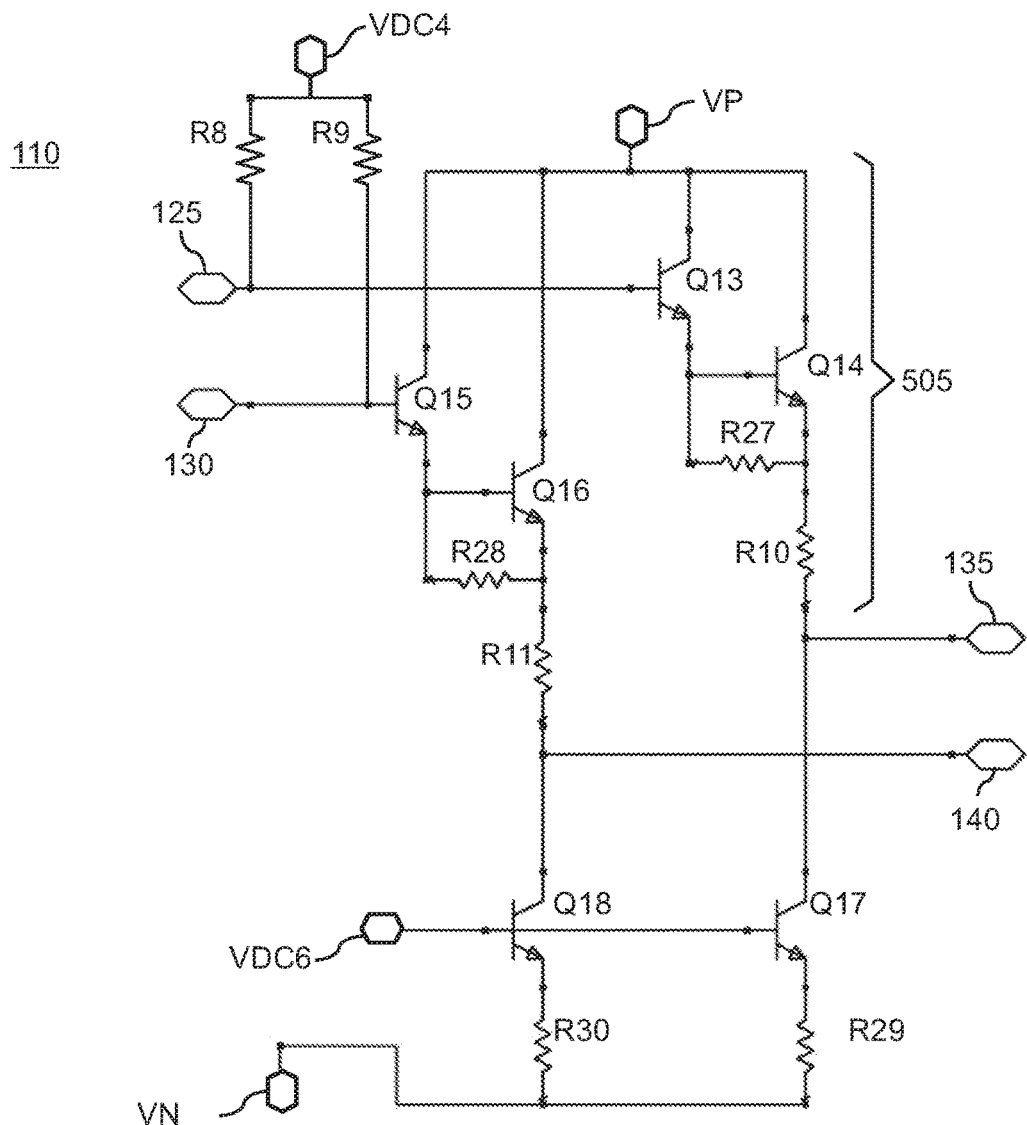
FIG. 10 is a circuit diagram illustrating level shifting circuitry in accordance with embodiments of the present disclosure.

FIG. 10 illustrates a circuit diagram of the level shifting circuitry 110 including the differential emitter follower circuitry 505 in accordance with embodiments of the present disclosure. Referring to FIG. 10, the differential emitter follower circuitry 505 comprises transistors Q13-16 and resistors R27-32. The differential emitter follower circuitry 505 provides a negative voltage shift from the positive common mode output voltage of the first stage TWA circuitry 105 to the negative common-mode input voltage of the second stage TWA circuitry 115. The positive common mode output voltage may be approximately +1.0 volts and the negative common-mode input voltage may be approximately −0.7 volts.

Transistors Q13 and Q14 are configured as cascaded emitter followers where the bias current to Q13 is determined by R27. A base of Q13 is coupled with interconnect 125 and resistor R8. Transistors Q15 and Q16 are configured as a second pair of cascaded emitter followers where the bias current to Q15 is determined by R28. Base-to-emitter junctions of the first and second cascaded emitter followers are configured to provide the negative voltage shift of approximately 1.7 volts. A base of transistor Q15 is coupled with interconnect 130 and resistor R9. Resistors R8 and R9 are further coupled with DC bias voltage VDC4 to provide the termination impedance for the first output transmission line 210. Collectors of transistors Q13-16 are coupled with positive supply voltage VP. A collector of transistor Q17 is coupled with resistor R10 and interconnect 135. A collector of transistor Q18 is coupled with R11 and interconnect 140. Bases of transistors Q17 and Q18 are coupled with DC bias voltage VDC6. Resistors R29 and R30 are coupled with respective emitters of transistors Q17 and Q18. Resistors R29 and R30 are further coupled with negative supply voltage VN. Collectors of transistors Q17 and Q18 provide bias for emitters of transistors Q14 and Q16 while providing a high impedance to the second input transmission line 305.

In FIGS. 8-10, transistors Q1-17 are illustrated as bipolar junction transistors (BJTs). In embodiments, transistors Q1-17 may each be configured to have a maximum oscillation frequency ($f_{max}$) greater than 300 gigaHertz. As such distributed amplifier system 100 may be configured to provide bandwidth from DC to greater than 33% of the maximum oscillation frequency (i.e. $>f_{max}/3$). The distributed amplifier system 100 may be further configured to provide a noise spectral density less than 1.5 nanovolts per square root Hertz and a total harmonic distortion less than −40 dB. Those skilled in the art will recognize that a functionally similar could be constructed with other types of transistors, such as junction gate field effect transistors (JFETs) or metal oxide semiconductor field effect transistors (MOSFETs).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Therefore, the embodiments disclosed should not be limited to any single embodiment, but rather should be construed in breadth and scope in accordance with the appended claims.

What is claimed is:

1. A distributed amplifier system comprising first stage traveling wave amplifier (TWA) circuitry controllable to provide one of a first set of discrete gain settings, the first stage TWA circuitry comprising:
   a first input transmission line;
   a first output transmission line; and
   a first plurality of amplifiers coupled antiparallel between the first input transmission line and the first output transmission line, wherein the first set of discrete gain settings has approximately constant logarithmic spacing.

2. The distributed amplifier system of claim 1, wherein each of the first plurality of amplifiers is configured to independently switch between an ON state and an OFF state by a first plurality of binary control signals.

3. The distributed amplifier system of claim 2, wherein:
   the distributed amplifier system further comprises second stage TWA circuitry coupled in series with the first stage TWA circuitry;
   the second stage TWA circuitry is controllable to provide one of a second set of discrete gain settings;
   the second set of discrete gain settings has approximately constant logarithmic spacing; and the second stage TWA circuitry comprises:
- a second input transmission line;
- a second output transmission line; and
- a second plurality of amplifiers coupled antiparallel between the second input transmission line and the second output transmission line, wherein each of the second plurality of amplifiers is configured to independently switch between an ON state and an OFF state by a second plurality of binary control signals.

4. The distributed amplifier system of claim 3, wherein level shifting circuitry is DC coupled between the first output transmission line and the second input transmission line.

5. The distributed amplifier system of claim 4, wherein the level shifting circuitry comprises a least one of an emitter follower amplifier or a source follower amplifier.

6. The distributed amplifier system of claim 5, wherein the first output transmission line and the second input transmission line are coupled transmission lines.

7. The distributed amplifier system of claim 6, wherein the first input transmission line is a single ended transmission line and the second output transmission line is a coupled transmission line.

8. The distributed amplifier system of claim 7, wherein the distributed amplifier system is controllable to provide a gain of at least 18 decibels (dB).

9. The distributed amplifier system of claim 8, wherein the first set of discrete gain settings are spaced apart by more than 3.0 dB and the second set of discrete gain settings are spaced apart by less than 1.0 dB.

10. The distributed amplifier system of claim 9, wherein a range of the first set of discrete gain settings is at least 16 dB and a range of the second set of discrete gain settings is at least 3 dB.

11. The distributed amplifier system of claim 10, wherein each of the first plurality of amplifiers is a transconductance amplifier.

12. The distributed amplifier system of claim 11, wherein a first amplifier of the first plurality of amplifiers comprises a bipolar junction transistor (BJT) and the distributed amplifier system is configured to provide bandwidth from DC to greater than 33% of a maximum oscillation frequency of the BJT.

13. The distributed amplifier system of claim 12, wherein the maximum oscillation frequency of the BJT is greater than 100 gigaHertz.

14. The distributed amplifier system of claim 13, wherein the distributed amplifier system is further configured to provide a noise spectral density less than 1.5 nanovolts per square root Hertz.

15. The distributed amplifier system of claim 14, wherein the distributed amplifier system is further configured to provide a total harmonic distortion less than −40 dB.

16. The distributed amplifier system of claim 15, wherein at least one of the second plurality of amplifiers is further configured as a frequency peaking amplifier.

17. The distributed amplifier system of claim 16, wherein at least two of the second plurality of amplifiers are further configured as frequency peaking amplifiers and the second stage TWA circuitry is controllable to provide one of a set of frequency peaking profiles.

18. The distributed amplifier system of claim 17, wherein the first input transmission line is configured to provide a characteristic impedance of approximately 50 ohms.

19. The distributed amplifier system of claim 18, wherein the first output transmission line, the second input transmission line, and the second output transmission line are each configured to provide a characteristic impedance between 25 ohms and 100 ohms.

20. The distributed amplifier system of claim 1, wherein the distributed amplifier system is implemented within signal input circuitry of at least one of an oscilloscope, a spectrum analyzer, or a signal analyzer.

* * * * *